United States Patent [19]

Bourgeois et al.

[11] Patent Number: 4,926,086
[45] Date of Patent: May 15, 1990

[54] PIEZOELECTRIC RESONATOR

[75] Inventors: Claude Bourgeois, Bole; Jean Hermann, Neuchatel, both of Switzerland

[73] Assignee: Centre Suisse D'Electronique Et De Microtechnique S.A., Switzerland

[21] Appl. No.: 373,470

[22] Filed: Jun. 30, 1989

[30] Foreign Application Priority Data

Jul. 7, 1988 [FR] France ................. 88 09221

[51] Int. Cl.$^5$ ............................................. H01L 41/08
[52] U.S. Cl. ..................................... 310/361; 310/368; 310/367; 310/366
[58] Field of Search ............... 310/360, 361, 367, 368, 310/366

[56] References Cited

U.S. PATENT DOCUMENTS

| | | | |
|---|---|---|---|
| 4,148,530 | 4/1979 | Calderara | 310/361 |
| 4,313,071 | 1/1982 | Hermann et al. | 310/361 |
| 4,437,773 | 3/1984 | Dinger | 310/361 X |
| 4,450,378 | 5/1984 | Hermann et al. | 310/361 |
| 4,472,655 | 9/1984 | Kawashima | 310/361 |

FOREIGN PATENT DOCUMENTS

| | | | |
|---|---|---|---|
| 0048819 | 3/1982 | Japan | 310/361 |
| 0111515 | 7/1983 | Japan | 310/361 |

*Primary Examiner*—Mark O. Budd
*Attorney, Agent, or Firm*—Arnold, White & Durkee

[57] ABSTRACT

A piezoelectric resonator formed as a thin parallelepipedic quartz plate whose width is arranged along the electric axis X of the crystal, the length along an axis Y' and the thickness along an axis Z', wherein the axes Y' and Z' form an angle approximately equal to 24° with the mechanical axis Y and the optical axis Z of the crystal, respectively, and the ratio w/l of its width to its length is approximately equal to 0.64.

11 Claims, 2 Drawing Sheets

PIEZOELECTRIC RESONATOR

BACKGROUND

The present invention relates to a piezoelectric resonator, vibrating in a contour mode, having a characteristic curve of variation of frequency as a function of temperature of the cubic type and capable of being produced by chemical etching of a quartz substrate.

A contour mode resonator has the form of a thin plate with displacement in its plane. Its thickness must be sufficiently small for the forces of inertia caused by movement outside the plane to have a negligible effect on the deformation energy. The most frequently adopted form is a rectangle which entails the existence of four geometric parameters, namely:

two angles of cut defining the direction of the normal to the plate;

one angle of cut defining the orientation of the sides of the rectangle in the plane of the plate, and a dimensional ratio between the sides of the rectangle.

For a resonator to be of practical interest, it is desireable for its first order thermal coefficient to be close to 0 at the average utilization temperature.

Differently cut quartz crystals are on the market, the GT cut being the one which has the most favorable thermal properties. It is a rectangular plate the dimensional ratio of which is equal to 0.86, and which is obtained by rotation about the electric axis X of the crystal followed by rotation +45° about the normal. The GT-cut resonator oscillates in a contour mode and more particularly in the elongation mode in the small dimension of the plate. The first and second order thermal coefficients are nil, and the third order coefficient is very small. The disadvantage of this cut arises from the fact that the thermal properties of the resonator depend critically on the dimensional ratio of the plate.

By way of example, for a GT-cut quartz crystal the first order thermal coefficient $\alpha$ is equal to $\pm 0.1 \times 10^{-6}/°C.$, the second order coefficient $\beta$ is equal to $\pm 1 \times 10^{-6}/°C.^2$ and the third order coefficient $\gamma$ is lower than $30 \times 10^{-12}/°C.^3$.

However, it should be noted that for a relative variation in the dimensional ratio w/l, equal to 1%, the variation of the first order thermal coefficient is equal to $2.5 \times 10^{-6}/°C$. This means that the thermal coefficient of a GT-cut quartz crystal inevitably has to be adjusted after assembly of the resonator.

Another known cut is the DT cut, which consists of a generally square plate obtained by rotation about the electric axis X and vibrating in a surface shear mode. DT-cut resonators have the advantage over GT-cut resonators of being insensitive to variations in the dimensional ratio. However, their thermal qualities are less advantageous. By way of example, the first order thermal coefficient $\alpha$ is nil, the second order thermal coefficient $\beta$ is equal to $-(15 \text{ to } 20) \times 10^{-9}/°C.^2$ and the third order thermal coefficient $\gamma$ is approximately equal to $45 \times 10^{-12}/°C.^3$.

AT-cut quartz crystals are also known, which are in the form of a plate obtained by rotation about the electric axis X of the crystal. The data for these quartz crystals are given in particular in the publication "Quartz Vibrators and Their Applications" by Pierre Vigoureux, published by His Majesty's Stationary Office, London 1950. Two types of AT-cut quartz crystals oscillating at a frequency of 4 MHz are currently on the market. These are the AT quartz by Nihon Dempa, of which the thermal properties at 25° C. are as follows:

first order thermal coefficient:
$\alpha = \pm 0.1 \times 10^{-6}/°C.$;
second order thermal coefficient:
$\beta = 4 \pm 1 \times 10^{-9}/°C.^2$;
third order thermal coefficient:
$\gamma = 95 \times 10^{-12}/°C.^3$;

and the AT quartz by the Societe Suisse pour L'Industrie Horlogere (SSIH), of which the thermal properties are 25° C. are as follows:

first order thermal coefficient:
$\alpha = \pm 0.1 \times 10^{-6}/°C.$;
second order thermal coefficient:
$\beta = (11 \pm 1) \times 10^{-9}/°C.^2$;
third order thermal coefficient:
$\gamma = 90 \times 10^{-12}/°C.^3$;

In addition to the thermal properties inferior to those of GT-cut quartz crystals, AT-quartz crystals have a frequency four times higher for comparable bulk. On the other hand, the first order thermal coefficient is more sensitive to differences in the value of the angle of cut. For example, for a variation $\phi$ in the angle $\phi$ equal to 1°, the corresponding variation $\alpha$ in the first order thermal coefficient is equal to $4.7 \times 10^{-6}/°C$. Moreover, the Nihon Dempa AT quartz has a complicated form, being bevelled at each end of the bar with the lateral faces being inclined. This results in the need for individual metallization after completion of machining. The SSIH AT quartz is very long, i.e., in the region of 11 mm.

Another equally well known resonator, with good thermal properties and quasi-independence of the first order thermal coefficient relative to the dimensional ratio w/l, is the ZT-cut quartz described in French Pat. No. 2,435,855. Such a resonator, the basic form of which is a rectangle, may also have a more complex structure by combining several basic rectangles which, from the point of view of the propagation of elastic waves, may be considered pseudo-free rectangles. Examples of such combinations may be found in the aforementioned French Patent and in French Pat. No. 2,521,782, which describes ZT-cut embeddable resonator structures.

ZT-cut resonators are obtained from a Z-cut substrate, that is a plate with the optical axis Z of the quartz crystal as its normal by a first rotation about the mechanical axis Y of the crystal, followed by a second rotation about the normal to the plane of the resonator. The need for two rotations may cause certain disadvantages. In particular, the second rotation in the plane of the substrate involves oblique orientation of the resonators with respect to the edges of the substrate and, consequently, non-optimum utilization thereof. Furthermore, when resonators are cut by chemical etching of the substrate, the lateral faces perpendicular to the direction of the vibration wave are oblique, rather than perpendicular, to the plane of the substrate. This obliqueness of the lateral faces may cause troublesome effects for which it is difficult to compensate. It has, in particular, the effect of favoring coupling between the desired contour mode and parasitic vibration modes outside the plane.

BRIEF SUMMARY OF THE INVENTION

One object of the present invention is to remedy the above-mentioned disadvantages of known resonators and to produce a resonator which involves only one rotation about the electric axis X of the crystal of a Z-cut substrate.

Another object of the invention is to provide a resonator whose lateral faces perpendicular to the direction of the vibration wave are perpendicular to the plane of the substrate when the resonator is made by chemical etching.

Yet another object of the invention is to provide a resonator comprising a plurality of basic rectangles arranged to permit it to be fixed to a case by embedding.

According to one characteristic of the invention, the resonator is made of a thin rectangular quartz plate whose width is arranged along the electric axis X of the crystal, the length is arranged along an axis Y' and the thickness is arranged along an axis Z'. The axes Y' and Z' form with the mechanical axis Y and the optical axis Z of the crystal, respectively, an angle $\phi$ approximately equal to 24°24' and the ratio w/l of the width to the length is substantially equal to 0.64. When such a resonator is obtained by chemical etching of such a plate, the lateral faces parallel to the axis Y' are in the principal plane of etching (direction of the axis Z) and are, for this reason, exactly perpendicular to the large surfaces of the resonator. It is desirable for the actual forms obtained to be as close as possible to the ideal forms in order to optimize the performance of the resonator. Furthermore, since the width of the resonator is arranged along the axis X, the cutting of a series of resonators from a rectangular substrate with the axes X and Y' as its edges makes optimum use of this substrate. The absence of rotation in the plane of the substrate reduces the cost of manufacturing of the resonators according to the present invention when compared to the cost of ZT-cut resonators described in the above-mentioned French Patents.

BRIEF DESCRIPTION OF THE DRAWINGS

Other aims, characteristics and advantages of the present invention will become clearer from a reading of the following particular examples, said description being given by way of non-limiting example and with reference to the attached drawings, in which.

DETAILED DESCRIPTION

Figure 1:
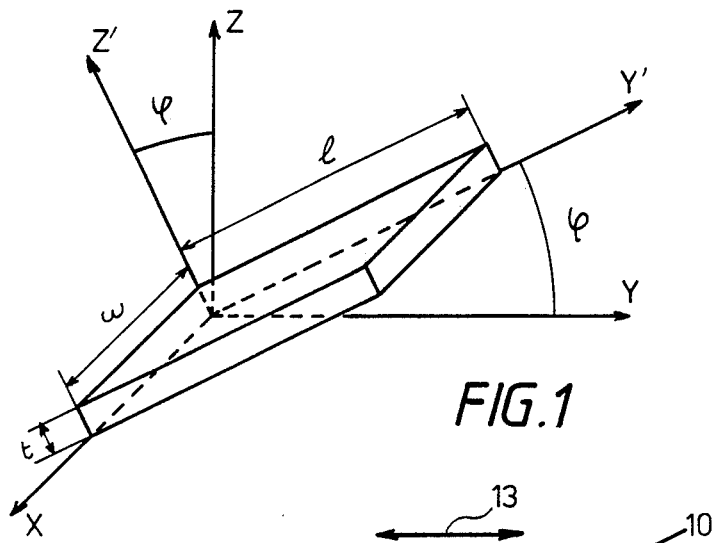
FIG. 1 shows the orientation of the basic structure of a resonator according to the invention with respect to the crystallographic axes X, Y and Z of a quartz crystal.

With reference to FIG. 1, the plate hereafter called the ZTX-cut plate is preferably obtained from a ZY-cut substrate, that is, a plate whose normal is the optical axis Z of the quartz crystal, the mechanical axis indicating the direction of the length of the plate. Rotation by the angle $\phi$ about the electric axis X turns the axis Y into Y' and the axis Z into Z'. The main directions X, Y' and Z' correspond respectively to the width w, the length l and the thickness t of the ZTX-cut plate. According to the IRE standards "Standards on Piezoelectric Crystals, 1949" published in Proceedings of the I.R.E., Vol. 37, No. 1 12, December 1949, such a cut is called (ZYW)$\phi$. The resonator according to the invention is then perfectly defined when the values of the angle $\phi$ and of the dimensional ratio of the width w to the length l of the resonator are specified. The preferred results are obtained when the angle $\phi$ is approximately equal to 24°24' and the dimensional ratio w/l is approximately equal to 0.64.

The characteristic curve of variation of frequency with temperature is a cubic curve, the point of inflexion (the second order thermal coefficient) of which may be adjusted by an appropriate choice of the dimensional ratio. The value of the first order thermal coefficient $\alpha$, which represents the slope of the characteristic curve at the point of inflexion, depends of the angle of cut $\phi$. It may be made zero or adjusted to a value close to zero according to the size of the temperature range over which the resonator has to exhibit good thermal properties. In addition to the adjustment of the angle of cut $\phi$ and the dimensional ratio w/l required for adaptation to the selected operating conditions (typical operating temperature and temperature range), it is also desirable to compensate for certain troublesome effects which cannot be anticipated. It is advisable to take into account, in particular, the, effect of metallization (electric, elastic and mass effects of the electrodes), of suspension of the resonator (soldering of suspension wires or suspension arms and embedding zones), of the non-zero value of the thickness of the resonator, of the manufacturing tolerances (obliqueness of certain faces due to the process of chemical etching), and the like. It will consequently be understood that the values indicated above for the angle of cut and dimensional ratio are typical values from which it is possible to depart by 1° to 3° for l and to 5% for w/l to tailor the resonator to the chosen application. The width w and the length l are selected in accordance with the operating frequency. The frequency per unit width is substantially equal to 2718 kHz.mm. The thickness t is, as with all contour mode resonators, a relative free parameter which can be used to optimize the performance of the resonator according to the invention.

Figure 2:
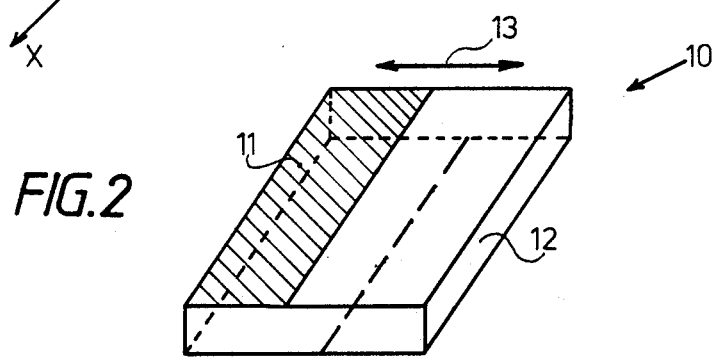
FIG. 2 is a perspective view of the resonator of FIG. 1 showing the location of the electrodes.

FIG. 2 shows an example of a resonator equipped with electrodes. Electrodes 11 and 12 are obtained by partial metallization of the large faces of the resonator 10 and are symmetrical with each other with respect to the center of the resonator. The width of the metallization is determined in accordance with the desired dynamic capacitance. The polarization of the electrodes generates a diagonal electric field permitting excitation of an elongation mode in the direction indicated by the arrow 13.

Figure 3:
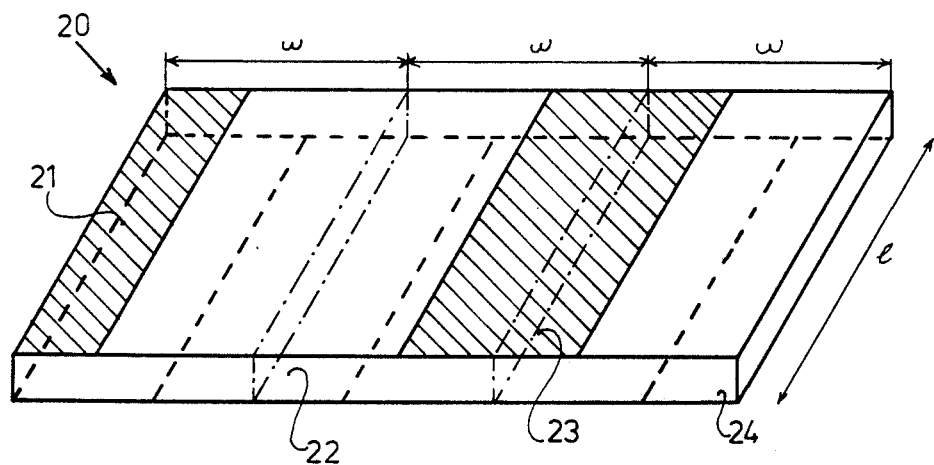
FIG. 3 shows a resonator obtained by combining three juxtaposed basic structures.

FIG. 3 shows further embodiment of the invention comprising a plate 20 which may be considered as the combination of 3 basic resonators, the width w and the length l of which are such that the ratio w/l is substantially equal to 0.64. The configuration of the electrodes 21, 22, 23, and 24 is also shown in the Figure.

It should be noted that the further embodiment of FIG. 3 constitutes an example of a possible configuration connecting several basic structures. Generally, a number N of basic structures may be combined so long as the direction of the vibratory movement is preserved.

Figure 4:
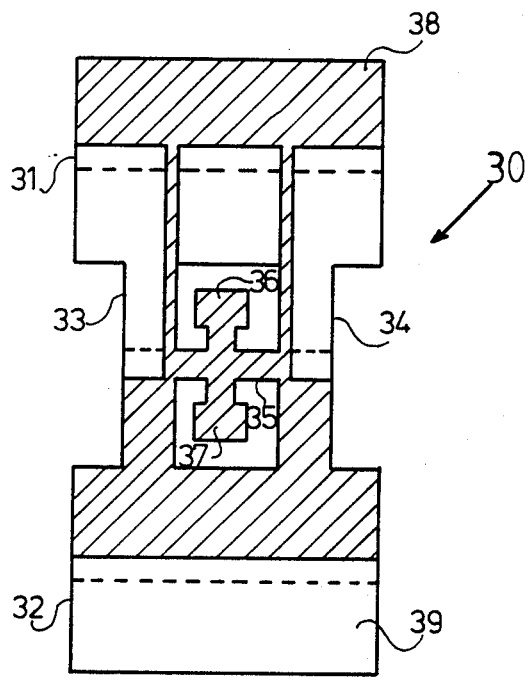
FIGS. 4 and 5 show examples of resonators more complex in form and enabling fixing thereof to a case by embedding.
Figure 5:
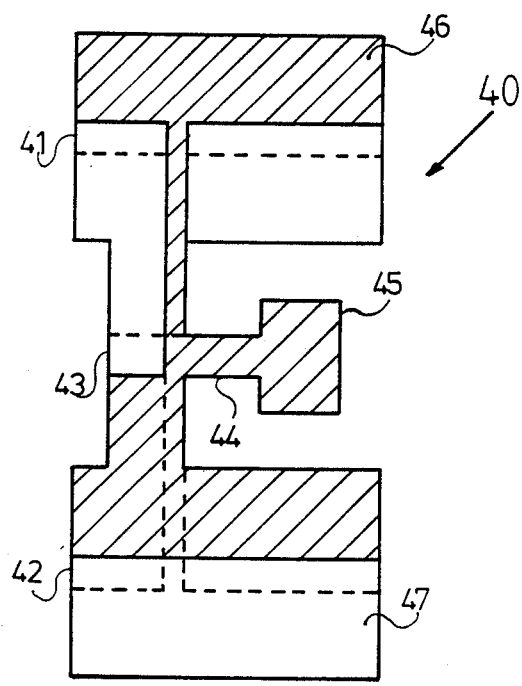

While the embodiments shown in FIGS. 1 to 3 could be fixed to a case through the intermediary of suspension wires fixed, by soldering, to the center of the large faces of the resonators, the embodiments of FIGS. 4 and 5 may be fixed to a case through the intermediary of a suspension arm integral with the resonator and comprising an embedding zone.

FIG. 4 shows a resonator 30 comprising two rectangular plates 31 and 32 connected by two resonant arms 33 and 34. The resonant arms are connected by a suspension arm 35 to two embedding zones 36 and 37. The metallization for the electrodes 38 and 39 is shown by a lined zone for one of the faces and by a dotted outline for the other face. The form of the electrodes only of FIG. 4 has already been described in the aforementioned French Pat. No. 2,521,782, but it remains applicable to a resonator according to the present invention. The plates 31 and 32 and the resonant arms 33 and 34 also constitute basic resonators like that described in relation to FIG. 1. As in the case of the above-mentioned French '782 Patent, the embedding zones may be connected only to a single one of the resonant arms.

FIG. 5 shows another form of embeddable resonator 40 comprising only one resonant arm 43 connecting two plates 41 and 42 and connected to an embedding zone 45 by a suspension arm 44. As in FIG. 4, the plates 41 and 42 and the resonant arm 43 also constitute basic resonators. The configuration of the electrodes 46 and 47 is also shown in a manner similar to that of FIG. 4.

Although the present invention has been described in the context of specific examples, it is not limited to these examples and it is capable of modifications and variation without going beyond its scope. The possibility, in particular, of combining several basic structures, for example, for operating at high vibration frequencies or for producing a structure having at least one evanescent zone which allows embedding of the resonator, permits a plurality of embodiments other than those described herein.

We claim:

1. A thin quartz crystal piezoelectric resonator having the form of a rectangular parallelepiped whose width w is arranged along the electric axis X of the crystal, the length l is arranged along an axis Y' and the thickness t is arranged along an axis Z', wherein said axes Y' and Z' form an angle y equal to $24°24' \pm 3'$ with the mechanical axis Y and the optical axis Z of the crystal respectively and the ratio w/l of the width to the length is equal to $N \times (0.64 \pm 0.03)$, where N is a whole number.

2. A resonator according to claim 1, wherein N is 1.

3. A resonator according to claim 1, wherein N is 3.

4. A resonator according to claim 1, comprising a plurality of pairs of electrodes located and polarized to excite a contour vibration mode.

5. A resonator according to claim 4, wherein said contour mode is an elongation mode in the direction of the width w.

6. A resonator according to claim 2, comprising a plurality of pairs of electrodes located and polarized to excite a contour vibration mode.

7. A resonator according to claim 6, wherein said contour mode is an elongation mode in the direction of the width w.

8. A resonator according to claim 3, comprising a plurality of pairs of electrodes located and polarized to excite a contour vibration mode.

9. A resonator according to claim 8, wherein said contour mode is an elongation mode in the direction of the width w.

10. A resonator according to claim 1, comprising two rectangular parallelepipedic plates (31, 32, and 46, 47) connected by at least one resonant arm (33, 34 and 43) wherein said resonant arm is connected to at least one embedding zone (36, 37 and 45).

11. A resonator according to claim 10, wherein said rectangular parallelepipedic plates are connected by two resonant arms (33, 34) and said arms are connected to at least one embedding zone (36, 37) by a suspension arm (35).

* * * * *